United States Patent [19]

Adam

[11] 4,283,692

[45] Aug. 11, 1981

[54] MAGNETOSTATIC WAVE SIGNAL-TO-NOISE-ENHANCER

[75] Inventor: John D. Adam, Murrysville, Pa.

[73] Assignee: Westinghouse Electric Corp., Pittsburgh, Pa.

[21] Appl. No.: 61,537

[22] Filed: Jul. 27, 1979

[51] Int. Cl.³ .............................................. H01P 1/23
[52] U.S. Cl. ................................. 333/17 L; 333/24.2; 333/81 A
[58] Field of Search ................... 333/17 L, 81 A, 24.1, 333/24.2, 161, 148

[56] References Cited

U.S. PATENT DOCUMENTS

| | | | |
|---|---|---|---|
| 3,317,863 | 5/1967 | Ngo | 333/24.2 X |
| 3,560,893 | 2/1971 | Wen | 333/24.1 |
| 4,152,676 | 5/1979 | Morgenthaler et al. | 333/24.1 |

OTHER PUBLICATIONS

Adam et al., *Microwave Magnetostatic Delay Devices, etc.*, Proc. of IEEE, vol. 64, No. 5, May 1976, pp. 794–800.
Clarricoats, *Microwave Ferrites*, John Wiley & Sons, Inc., N.Y., 1961, Title page and p. 69.

*Primary Examiner*—Paul L. Gensler
*Attorney, Agent, or Firm*—D. Schron

[57] ABSTRACT

A magnetostatic wave device having a microstrip transmission line in conjunction with a YIG thin film biased for magnetostatic wave operation at a level where relatively lower power input microwave signals are highly attenuated up to a critical point past which the relative attenuation is greatly reduced. Such devices may be utilized as signal-to-noise enhancers in microwave circuits such as frequency memory loops.

10 Claims, 14 Drawing Figures

MAGNETOSTATIC WAVE SIGNAL-TO-NOISE-ENHANCER

BACKGROUND OF THE INVENTION

1. Field of the Invention

The invention in general relates to microwave signal processing, and particularly to a two port magnetostatic wave device.

2. Description of the Prior Art

In the microwave signal processing field, circuits or devices which increase the signal to noise ratio are key components in such circuitry as frequency memory loops which are important in electronic countermeasure systems.

A memory loop generally consists of an amplifier having feedback through a delay line with conditions being such that the loop will oscillate and produce a CW output signal in response to an input pulse signal. If the input frequency signal includes noise, the amplifier not only amplifies the signal but also amplifies this noise which results in a reduction in the maximum storage time of the loop and in a degraded, and sometimes unusable output signal. To avoid this, signal-to-noise enhancers are utilized and may include ferrite reflectors in conjunction with circulators and matching circuitry. Many such enhancers have limited bandwidth capabilities.

The present invention provides for a signal to noise enhancer which is of extremely simple construction and achieves broad bandwidth operation utilizing gyromagnetic materials such as a ferrite. By way of example such devices find use in the microwave signal processing art as two port non-reciprocal attenuators or two port attenuators, the attenuation of which is variable in accordance with a variable applied magnetic bias field. Such attenuators, however, would not function to increase the signal to noise ratio if utilized, for example in a frequency memory loop.

SUMMARY OF THE INVENTION

The signal to noise enhancer of the present invention is a magnetostatic wave device which includes a magnetostatic wave supporting material. A microwave transmission line having first and second ends is contiguous the material so as to launch magnetostatic waves thereinto. Input and output means are coupled to respective ends of the microwave transmission line and the material is magnetically biased for magnetostatic wave operation wherein at relatively low power levels of input signal applied at the input, the resulting launched magnetostatic waves operate to remove power from the transmission line resulting in attenuation of the signal. The magnetic means provide a magnetic bias field of a particular value such that past a certain critical input signal power level, the power removed by the magnetostatic waves is reduced relative to the input signal thereby resulting in a relative reduction of the attenuation so that in effect the attenuation of input signals of relatively low power levels is much greater than the attenuation of input signals of relatively higher power levels.

DESCRIPTION OF THE PREFERRED EMBODIMENT

Figure 1:
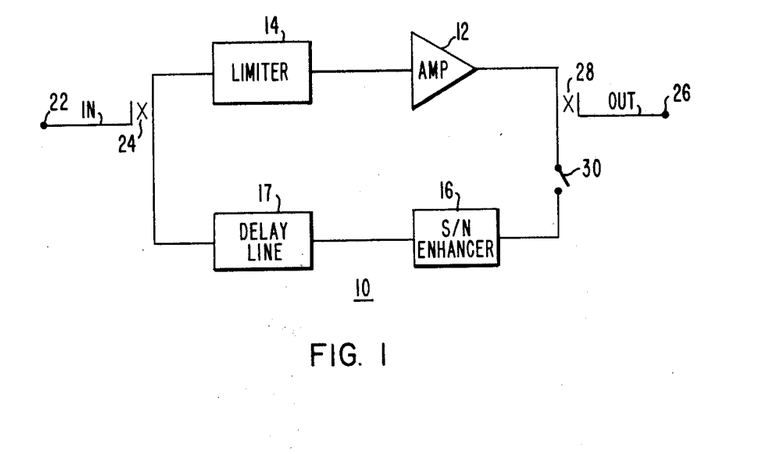
FIG. 1 is a block diagram of a frequency memory loop.

Referring now to FIG. 1, there is illustrated a frequency memory loop 10 which includes an amplifier 12, and a limiter 14 operable to prevent power saturation of the amplifier. Also included in the feedback loop is a signal-to-noise enhancer 16, and a delay line 17 which allows the feedback system to oscillate at frequencies which are multiples of 1/T, where T is the delay time of the delay line.

Figure 2:
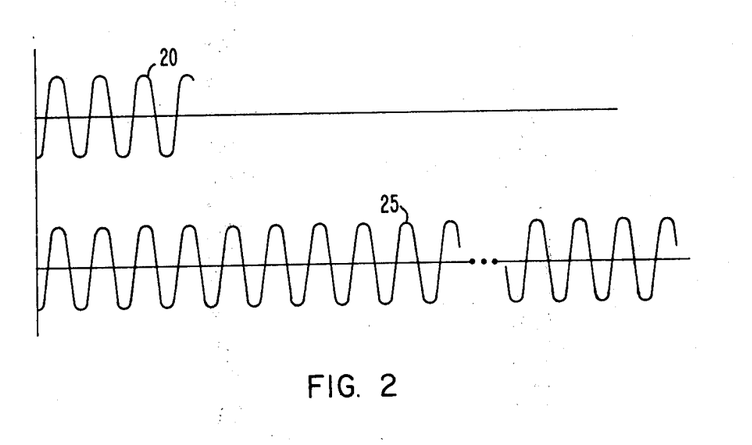
FIG. 2 illustrates the input and output waveforms of the memory loop of FIG. 1.

An input pulse signal such as signal 20 in FIG. 2 is applied at the input 22 and coupled into the feedback loop by means of directional coupler 24. In response to the input signal, and operation of the feedback loop, an output signal such as signal 25 in FIG. 2 appears at output 26 and is coupled thereto by means of directional coupler 28. Oscillations may be terminated by opening switch 30 which may be of the electronic variety. Such frequency memory loops are utilized to identify one or more incoming frequencies for analysis, such as may be required in various electronic countermeasure systems.

The key to successful operation of the loop as a long-term frequency memory is to avoid the buildup of noise energy. That is, the signal 20 generally includes a relatively lower power noise component. This noise component gets circulated around the loop along with the signal component and along with other noise generated by the loop components, and after several amplifications would quickly build up to an objectionable level approaching the signal level. At microwave frequencies, this level can be reached after several microseconds whereas the storage of the frequency signal may be desired for many milliseconds. Accordingly, the signal-to-noise enhancer 16 is included in the feedback loop to eliminate this problem. Presently available devices require the use of multiport circulators, ferrite reflector devices, coupling circuitry, and matching networks.

The signal-to-noise enhancer of the present invention is a two port device of simple construction which achieves desired operation over a relatively broad bandwidth. The device, illustrated in FIGS. 3 to 6, operates at elevated microwave frequencies in the gigahertz region and utilizes magnetostatic waves, which are long wavelength spin waves which propagate at microwave frequencies in ferromagnetic materials placed within a biasing magnetic field. The preferred propagation medium is single crystal, yttrium iron garnet (YIG) which is generally grown by liquid phase epitaxy on a matching non-magnetic single crystal substrate of gadolinium galium garnet (GGG).

The device illustrated in FIGS. 3 to 6 includes such YIG film 40 on a GGG substrate 41. YIG 40 is contiguous, that is, either touching or disposed slightly above a microwave transmission line in the form of a microstrip 43 deposited upon a substrate member 46 such as alumina, having a metallized undersurface 48 forming a ground plane.

Figure 3:
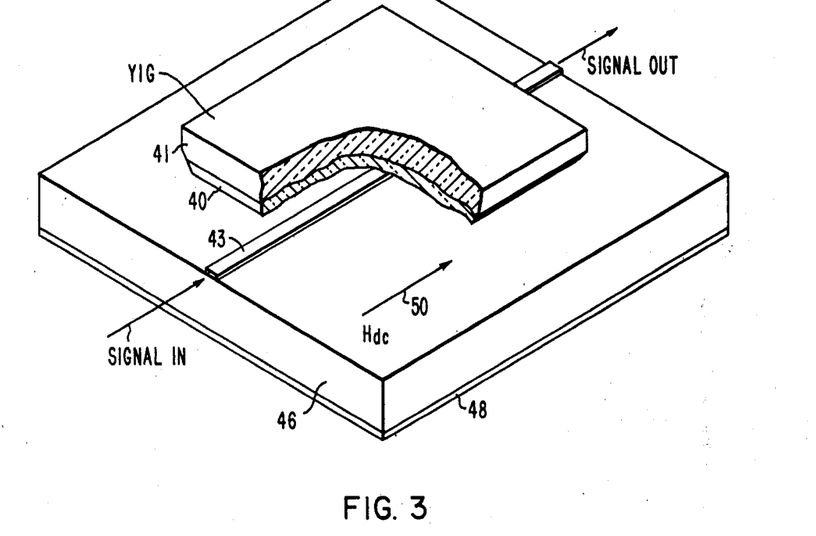
FIG. 3 is a view with a portion broken away of one embodiment of the present invention.

For magnetostatic wave propagation, a DC magnetic bias field is applied to the YIG sample and if the field is applied in the direction of arrow 50, magnetostatic surface waves will be launched and propagated in the YIG in response to an input signal applied to the microwave transmission line 43. Magnetostatic volume waves are also possible with different directions of the magnetizing field relative to the YIG film, as is well known to those skilled in the art.

Figure 4:
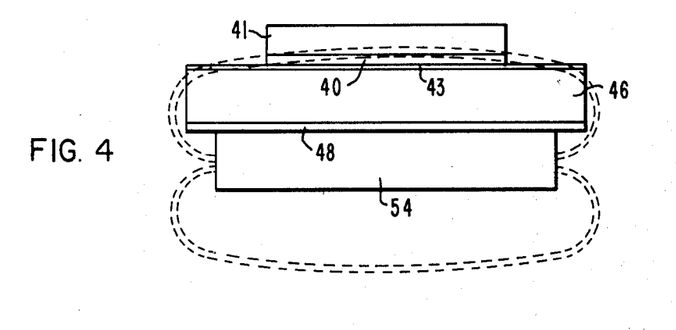
FIG. 4 is a side view of the device of FIG. 3 illustrating a magnetic biasing arrangement.

In order to provide the necessary magnetic field, the device, as is commonly done, may be placed between the poles of a magnet, or alternatively as illustrated in FIG. 4 the device may be placed adjacent a magnet 54 in a manner that the flux lines of the magnet, as represented by the dotted lines, pass through the YIG film 40.

Figure 5:
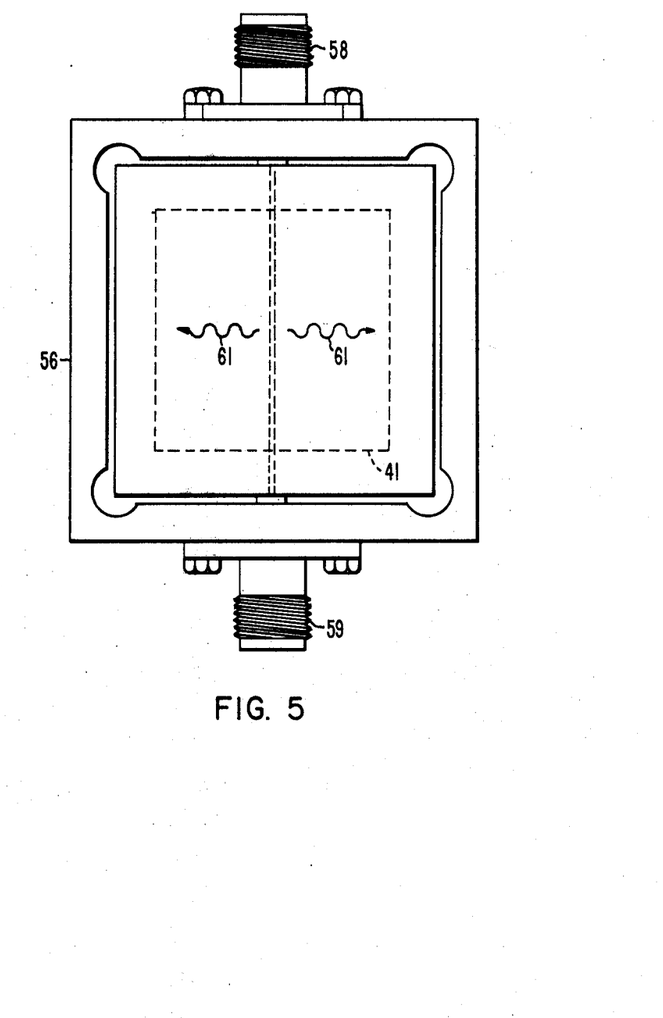
FIG. 5 is a plan view of the device of FIG. 3 further illustrating a packaging arrangement therefor.
Figure 6:
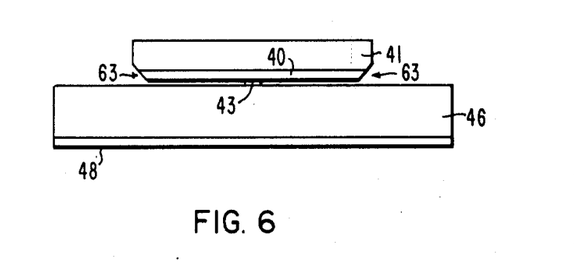
FIG. 6 is a front view of the device of FIG. 3.

A plan view of the device is illustrated in FIG. 5 which further illustrates a housing 56 (with the cover removed) and respective input and output microwave connectors 58 and 59. Upon the application of an input signal at connector 58, a magnetostatic wave as represented by arrows 61 is launched in the YIG film. The launching of a magnetostatic wave removes power from the transmission line such that the output signal at output connection 59 is attenuated. In order to prevent the magnetostatic waves from bouncing off the edge of the YIG film and returning power to the transmission line, means are provided for absorbing or otherwise preventing the reflection of the wave. One means of accomplishing this is better illustrated in FIG. 6 which shows the edge of the YIG film 40 (and also some of the GGG substrate 41) beveled as at 63.

Figure 7:
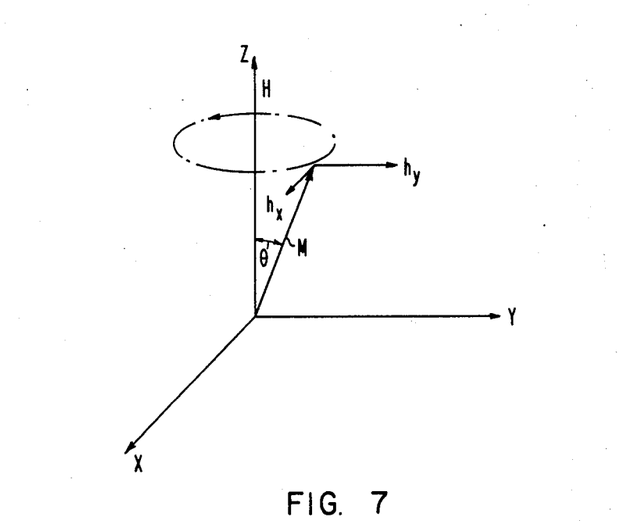
FIG. 7 is an XYZ coordinate system illustrating a spin magnetization of a magnetostatic wave.

The nature of the magnetostatic wave may be explained with reference to FIG. 7 which shows an XYZ coordinate system and wherein the arrow M represents the magnetization of spin. $h_y$ and $h_x$ are the two components of the magnetic field due to a microwave signal in the transmission line, the power level of such signal determining the angle $\theta$ at which M lies. A DC magnetic bias field H is in the direction of the Z axis. The spin magnetization precesses around the Z axis and the greater the current in the transmission line, the greater will be the spin precession angle $\theta$, with the increase in angle being transferred to adjacent spins resulting in the spin wave. With increasing power levels, the spin precession angle $\theta$ increases up to a point past which increasing the power level does not increase the angle $\theta$. At this point, the spin precession is said to "stick" at a critical angle $\theta_c$ thus limiting the power level in the magnetostatic wave.

In the present invention, the magnetic bias is particularly chosen so as to provide attenuation of the microwave signal at relatively low power levels whereas past a certain power level input, corresponding to $\theta_c$, any increase in power level will not be transferred to the magnetostatic wave and accordingly a corresponding reduction in attenuation of the microwave signal takes place. In essence, the magnetostatic waves act as a saturable absorber of power from the transmission line.

Figure 8:
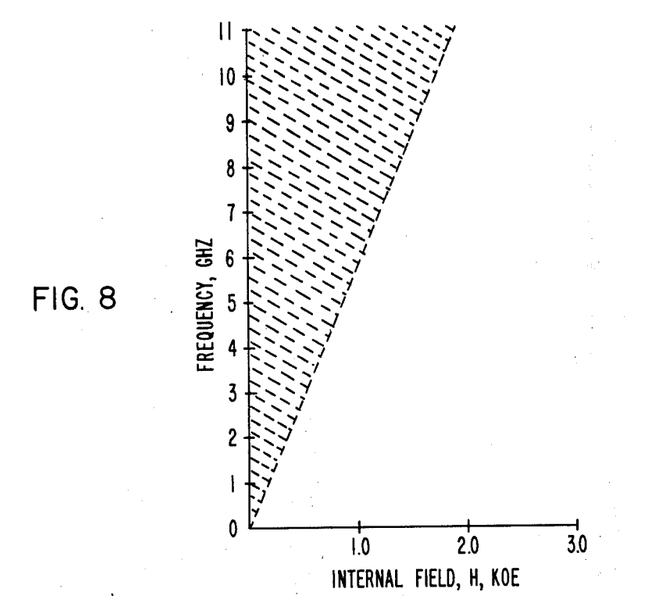
FIG. 8 is a graph of frequency vs. internal field illustrating a region where half frequency spin waves exist in YIG.

This attainment of $\theta_c$ is achieved if operation of the device is such that half frequency spin waves ($\omega/2$) exist. In FIG. 8, frequency in gigahertz is plotted on the vertical scale and internal field H in kilo-oersteds is plotted on the horizontal scale, for a YIG sample. The internal field is the effective field inside the film after demagnetizing and anisotropy effects have been accounted for. The shaded portion of the graph illustrates the region of operation wherein half frequency spin waves exist for the YIG film sample. Physically, the generation of half frequency spin waves occurs very rapidly at $\theta_c$ and energy which previously increased the angle $\theta$ is utilized in the production of half frequency spin waves which propagate and are dissipated.

Figure 9:
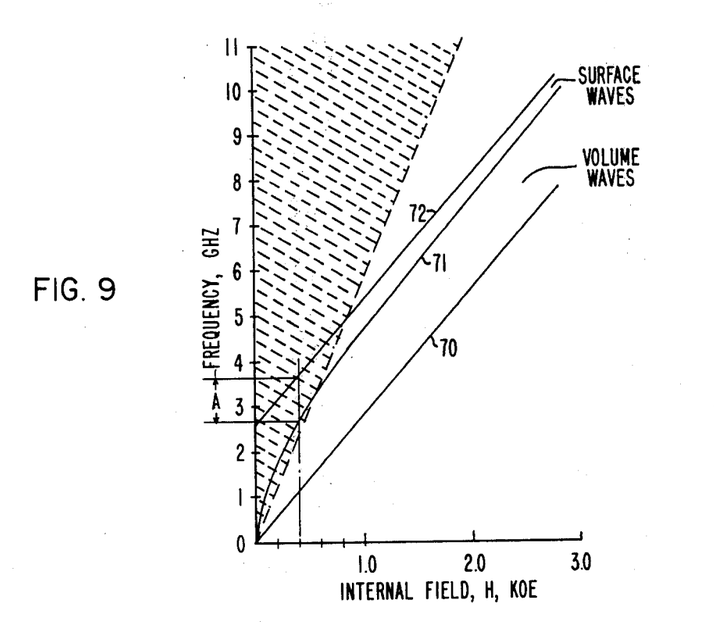
FIG. 9 is a curve as in FIG. 8 further illustrating frequency limits for magnetostatic surface waves and magnetostatic volume waves in YIG.

FIG. 9 duplicates FIG. 8 and further illustrates the frequency limits of magnetostatic surface and volume waves in the YIG film as a function of internal bias field. The volume wave limits are defined by lines 70 and 71 and the surface wave limits are defined by lines 71 and 72. With the biasing direction chosen to produce magnetostatic surface waves, the internal field is substantially equal to the applied magnetic bias field and the frequency limits of operation would be governed by the vertical distance between lines 71 and 72 for the particular bias field. For example, a bias field of 400 oersteds would result in a desired operation in the frequency range defined by the bandwidth A. A slight increase in bias field would somewhat reduce the bandwidth but increase the minimum and maximum operating frequencies whereas a decrease in bias would increase the bandwidth and reduce the minimum and maximum operating frequencies.

Figure 10:
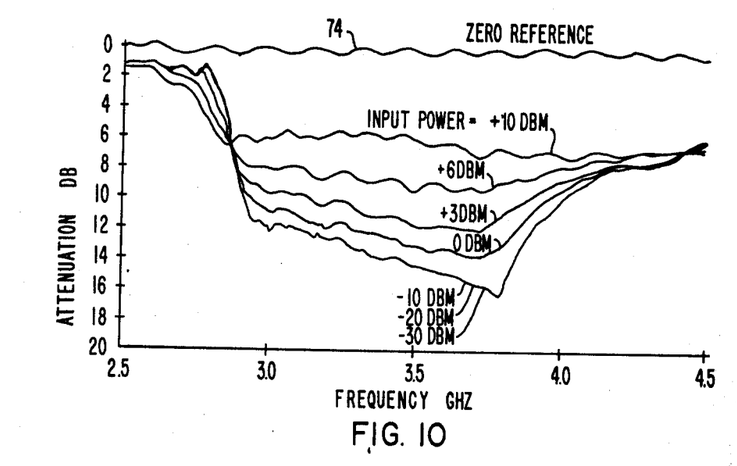
FIG. 10 are curves illustrating the operation of the device of FIG. 3.

A device such as that illustrated in FIGS. 3-6 was tested and the experimental results are illustrated in FIG. 10 wherein frequency in gigahertz is plotted on the horizontal scale and attenuation in decibels on the vertical scale. A family of curves is illustrated, each one representing a particular power level of microwave input signal ranging from +10 dBm to −30 dBm, where dBm is the power referenced to 1 milliwatt. The curves for −10, −20 and −30 dBm are so close as to appear as one curve.

The parameters resulting in the data of FIG. 10 are as follows:
Film 40—YIG
YIG film thickness—58 microns
Substrate 41—GGG
Substrate 46—alumina
Microstrip transmission line 43—gold
Microstrip transmission line width—50 microns
Bias—450 oersteds.

FIG. 10 illustrates that for relatively low power levels of input signal, for example −10 to −30 dBm, the attenuation was relatively high, for example ranging from approximately 12 dB at 3 gigahertz to approximately 15 dB at 3.75 gigahertz. Lower power levels would also encounter this same attenuation. On the other hand, with relatively higher power levels of input signals such as +10 dBm, the attenuation is only 6 dB within that frequency range. For operation in a frequency memory loop such as illustrated in FIG. 1, if the amplifier is designed to give a gain of +7 dB to its input signal, the higher power level input signals, representing the information signal, will be continuously amplified (but eventually limited by limiter 14) whereas the lower power level signals representing unwanted noise even though raised to a level 7 dB higher will continuously be in the region of greater attenuation. For example, let it be assumed that a +10 dBm signal is applied at the input of the signal-to-noise enhancer. It will be attenuated 6 dB so that the input to the amplifier for the signal will be +4 dBm. The signal at the output of the amplifier will be raised by 7 dB bringing it to 11 dBm for which the attenuation would be less than the previous +10 dBm signal after passing through the signal-to-noise enhancer. Let it be assumed for purposes of example that a noise signal has a power level of −10 dBm experiencing an attenuation of 14 dB in the signal-to-noise enhancer. The noise signal to the amplifier will therefore have a power level of −24 dBm which, even though raised to −17 dBm by the amplifier, will still be suppressed relative to the information signal by the operation of the signal-to-noise enhancer since it would always be in the greater attenuation range. As a reference, curve 74 of FIG. 10 represents the results of operating the device of FIG. 3 at a sufficiently high bias so that no magnetostatic waves are produced to carry the power away from the transmission line. Curve 74 illustrates a relatively constant value approximately 0 dB across the entire frequency range.

As seen in FIG. 10, between the frequency limits within which selective attenuation occurs depending upon input power level, the value of attenuation for a particular curve may vary as a function of frequency. In order to reduce this variation, it is preferred that the width of the microstrip transmission line 43 be of the same order of magnitude as the thickness of the YIG film 40. If desired, spacing of the YIG film from the transmission line can be used to reduce the attenuation at the high frequency end of the characteristic.

Figure 11:
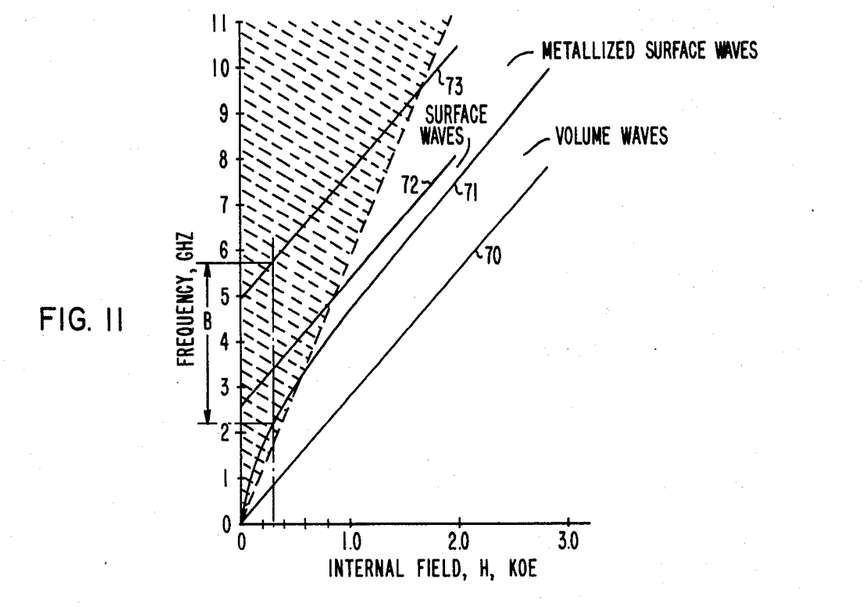
FIG. 11 is a graph as in FIG. 9 further illustrating the frequency limits of metallized surface waves in YIG.

From the curves of FIG. 9, it may be seen that the maximum operating frequency for surface waves in practicing the invention is little over 4 gigahertz, the device having an instantaneous bandwidth of approximately 1 gigahertz. One way to increase the instantaneous bandwidth and maximum operating frequency is to metallize an epitaxial YIG surface. The effect of metallization is illustrated in FIG. 11 which reproduces the curves of FIG. 9 and additionally includes a metallized surface wave region which extends between lines 71 and 73 and for an operating bias field of close to 300 oersteds results in a maximum operating frequency of approximately 6.0 gigahertz and a bandwidth B of about 3.6 gigahertz.

Figure 12:
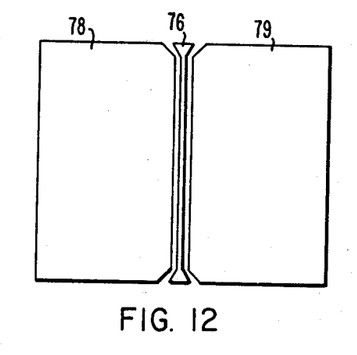
FIGS. 12 and 13 are views of planar microwave transmission lines for launching magnetostatic surface waves.
Figure 13:
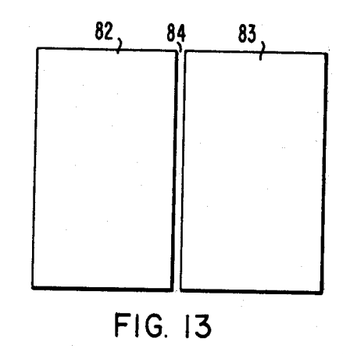

To generate such surface waves, the YIG film (or a separate substrate), may be metallized by depositing a gold film on it in the shapes such as illustrated in FIGS. 12 and 13. FIG. 12 is a coplanar arrangement which includes a central conductor 76 and coplanar ground planes 78 and 79. The two metallized sections 82 and 83 of FIG. 13 may be deposited to form a slot line arrangement wherein the microwave signal will be propagated in the space 84 located between the sections 82 and 83.

Figure 14:
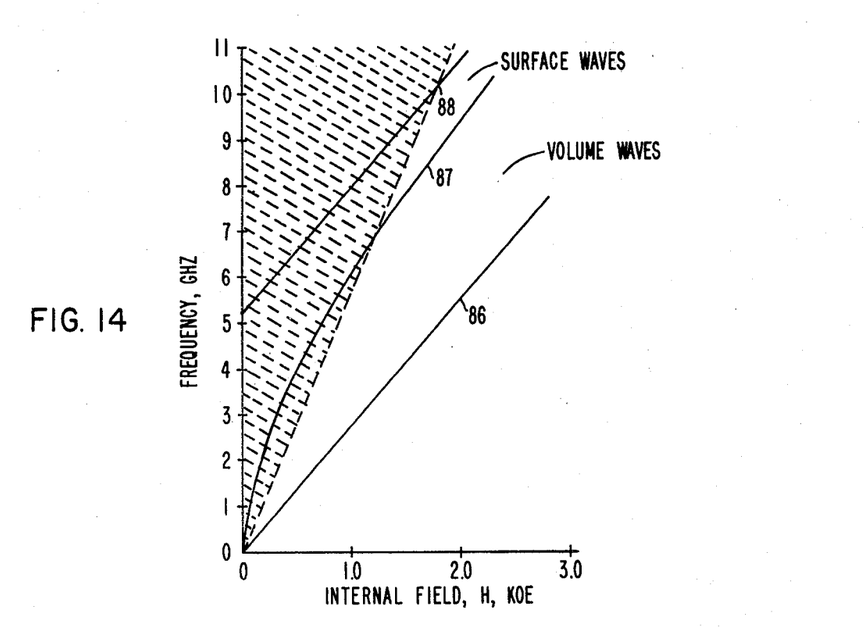
FIG. 14 is a graph as in FIG. 9 illustrating the frequency limits of magnetostatic surface waves and magnetostatic volume waves for a different material.

Another technique to increase the upper operating frequency while still utilizing a microstrip transmission line as in FIG. 3, is to use a ferrite material with a higher saturation magnetization ($4\pi M$) than YIG. A suitable candidate is lithium ferrite which has a $4\pi M$ of 3700 Gauss. FIG. 14, like FIG. 9, illustrates the frequency limits of magnetostatic volume and surface waves, in addition to the region where half frequency spin waves exist, for a lithium ferrite sample. It is seen that volume wave operation is defined by the region between lines 86 and 87 and surface wave operation is defined by the region between lines 87 and 88.

By combining various devices described herein a signal-to-noise enhancer may be provided which is operable over an extremely wide bandwidth.

From the curves of FIGS. 9, 11, and 14, it is seen that volume waves offer potentially wider bandwidths than surfaces waves. However, operation at the lower power levels cannot be achieved since the volume wave region does not substantially fall within the half frequency spin wave region. Although not shown, a critical power level and critical angle $\theta$ is achievable with volume waves within a region where double frequency spin waves are produced, the operation being similar to that already described, however at much higher power levels. For example, with half frequency spin waves the threshold power level is typically around −20 dBm whereas for double frequency waves the power threshold would be in the order of +10 to +20 dBm.

What we claim is:

1. A magnetostatic wave signal-to-noise enhancer comprising:
   (a) a magnetostatic wave supporting material;
   (b) a microwave transmission line, having first and second ends, and being contiguous said material to launch magnetostatic waves thereinto;
   (c) input means coupled to one end of said transmission line for applying an input signal within an operating frequency range;
   (d) output means coupled to the other end of said transmission line;
   (e) magnetic means biasing said material for magnetostatic wave operation wherein at relatively low power levels of input signal, launched magnetostatic waves remove power from said transmission line resulting in attenuation of said signal and past a certain critical input signal power level said power removed by said magnetostatic waves is reduced relative to said input signal power, resulting in a relative reduction of said attenuation; and
   (f) means for preventing launched magnetostatic waves from reflecting from the edges of said thin film material back to said transmission line.

2. Apparatus according to claim 1 wherein:
   (a) said transmission line touches said magnetostatic wave supporting material.

3. Apparatus according to claim 1 wherein said magnetostatic wave supporting material is a thin film ferromagnetic material.

4. Apparatus according to claim 3 wherein:
   (a) the thickness of said thin film is of the same order of magnitude as the width of said transmission line.

5. Apparatus according to claim 1 wherein:
   (a) said thin film material includes beveled edges to prevent launched magnetostatic waves from reflecting from the edges of said thin film material back to said transmission line.

6. Apparatus according to claim 1 wherein:
   (a) said magnetostatic wave supporting material is biased for launching magnetostatic surface waves therein.

7. Apparatus according to claim 1 wherein:

(a) said transmission line is a relatively thin microstrip line.

8. Apparatus according to claim 1 which includes:
(a) a substrate dielectric member;
(b) said transmission line being deposited on said substrate dielectric member.

9. Apparatus according to claim 1 wherein:
(a) said transmission line includes a central microstrip line and two ground planes coplanar therewith, one on either side of said central microstrip line.

10. Apparatus according to claim 1 wherein:
(a) said transmission line is a stripline configuration comprised of two coplanar ground planes separated by a predetermined distance.

* * * * *